United States Patent [19]
Duong et al.

[11] Patent Number: 5,712,579
[45] Date of Patent: Jan. 27, 1998

[54] DESKEWED CLOCK DISTRIBUTION NETWORK WITH EDGE CLOCK

[75] Inventors: Khue Duong; Stephen M. Trimberger, both of San Jose; Robert O. Conn, Jr., Los Gatos; John E. Mahoney, San Jose, all of Calif.

[73] Assignee: Xilinx, Inc., San Jose, Calif.

[21] Appl. No.: 543,693

[22] Filed: Oct. 16, 1995

[51] Int. Cl.$^6$ .......................... H03K 19/177; H03K 19/00
[52] U.S. Cl. ................................ 326/93; 326/41; 326/47; 326/101
[58] Field of Search ...................... 326/93, 41, 47, 326/101

[56] References Cited

U.S. PATENT DOCUMENTS

| | | | |
|---|---|---|---|
| 5,140,184 | 8/1992 | Hamamoto et al. | 326/93 |
| 5,391,942 | 2/1995 | El-Ayat et al. | 326/93 |
| 5,397,943 | 3/1995 | West et al. | 326/93 |
| 5,467,033 | 11/1995 | Yip et al. | 326/93 |
| 5,481,209 | 1/1996 | Lim et al. | 326/93 |

*Primary Examiner*—Edward P. Westin
*Assistant Examiner*—Richard Roseen

*Attorney, Agent, or Firm*—Jeanette S. Harms; Wagner Mirabito & Hao

[57] ABSTRACT

A clock distribution network and mechanisms therein for an integrated circuit (IC) including an edge clock and distribution system for same. The invention includes a deskewed clock distribution network for circuits situated in columns wherein buffering is done in columns less than half of the IC length. The mechanism allows each of at least eight vertical column distribution lines to couple with any horizontal clock supply line of at least eight lines. The horizontal clock supply lines include local interconnect inputs. To increase clock source signals, special lines, Kx lines, are provided that are buffered and traverse directionally in ¼ IC lengths from the top down, bottom up, and midsection both up and down. Kx lines can be sourced from carry signals, IOBs, interconnects, or from an edge clock and supply to clock lines, longlines, or interconnect lines. Kx lines allow vertical signal displacement, e.g., for clock signals, etc., within the chip. An edge clock is provided that is not deskewed and is directly coupled to an edge clock distribution system along the left and right edges of the IC to supply a clock signal to an entire edge or half of an edge with less delay relative to the deskewed clock. Also, a super fast edge clock is provided for very high speed circuits.

40 Claims, 12 Drawing Sheets

DESKEWED CLOCK DISTRIBUTION NETWORK WITH EDGE CLOCK

BACKGROUND OF THE INVENTION

1. Field of the Invention

The field of the invention relates to clock distribution networks and mechanisms within an integrated circuit.

2. Background Technology

Programmable integrated circuits (ICs), such as field programmable gate arrays (FPGAs), contain a number of configurable logic blocks or circuits (CLBs), decoders, input/output blocks (IOBs), and programmable interconnect structure to allow the circuits to be programmably coupled together using either programmable interconnect points (PIPs), that are controlled by memory cells, or antifuses. The IOBs couple to pads of the programmable integrated circuit and receive and transmit signals over the pads. Typically, each IOB contains an input signal receiving circuit and an output signal driving circuit.

The distribution of signals to the different circuits of the IC is an important task and is done using mechanisms that attempt to increase signal routing flexibility and decrease signal skew. Signal skew is a problem in clock distribution networks in devices that operate with a relatively high frequency or where the propagation delay of clock signals within the IC is a critical delay. In order to decrease signal skew, prior art signal distribution systems attempt to supply the clock signal through buffered networks that are distributed across the IC.

FIG. 1A illustrates one such distribution network where an input clock signal is taken from a selection of lines at the input of multiplexer (mux) 32 and buffered by buffer 34. The mux 32 is located at the mid section of the IC 30. The buffer 34 and mux 32 are repeated a number of times (not shown) so that a number of horizontal supply signal lines 36 are generated. These horizontal supply signal lines 36 are interconnected via hardwire connections 42 to a number of vertically arranged column distribution lines 38 that distribute the signals up and down a column of CLBs within IC 30. This distribution mechanism is duplicated for each column of CLBs in IC 30. Although effective at reducing skew in many applications, a large amount of resistance and capacitance is associated with the column distribution lines 38 because they run the entire length of a column. This resistance and capacitance causes signal delay with respect to the input signal at the pad. Therefore, a need arises for a signal (e.g., clock) distribution network that reduces the resistance and capacitance of these column distribution lines 38.

FIG. 1B illustrates an interconnect arrangement of a prior art signal distribution network in which signal on eight signal supply lines 40(1)–40(8) are selectively driven over four column distribution lines 44a–44d. At the intersection of the supply and distribution lines, a particular pattern of programmable interconnection points (PIPs) 42 is provided. These PIPs may be implemented as a multiplexer 32 as shown in FIG. 1A. Note that the circuit of FIG. 1B is replicated for each column of CLBs in IC 30. While effective in many applications, this prior art mechanism is disadvantageous because only half of the signal lines 40(1)–40(8) can be programmably coupled to column distribution lines 44a–44d because there are eight supply lines and only four column distribution lines. Further, coupling is limited such that any supply line of 40(5)–40(8) is connectable to only one of the column distribution lines 44a–44d. In other words, only a partial interconnect is supplied for those supply lines. Therefore, a need arises to increase signal routing flexibility between a set of horizontal supply lines and a set of vertical column distribution lines.

An additional problem exists in prior art systems adopting this circuit because the source of the signals over horizontal supply lines 40(0)–40(8) is typically provided directly from an IOB. Therefore, a need arises for more flexibility in the source of signals that can be driven over the horizontal supply lines.

Yet another problem associated with by prior art signal distribution networks in a programmable IC is that often a designer requires more clock supply lines than are available for distribution to the CLB columns. Therefore, a need arises for a network mechanism that can provide additional clock distribution lines in these instances.

Finally, within clock distribution systems that provide a global deskew network, the deskewed clock is delayed with respect to the input clock signal at the IC's pad because of the propagation delay associated with the signal path from the IC pad to the distribution points within the deskewed network. In some high speed applications, such as data reception, the delay associated with the deskewed clock is unacceptable. Therefore, a need arises for a clock distribution system that provides a deskewed clock for internal circuitry but also supplies a clock with delay.

SUMMARY OF THE INVENTION

A clock distribution network and mechanisms therein are described for an integrated circuit (IC) including an edge clock and a distribution system. The invention includes a deskewed clock distribution network for circuits situated in columns wherein buffering is done to each column separately. The columns are less than half of the IC length and disposed vertically within top and bottom halves of the IC. The mechanism allows each of at least eight vertical column distribution clock lines to couple with any horizontal supply line of at least eight lines. The horizontal clock supply lines include local interconnect inputs.

To increase clock source signals for the CLBs, special directional lines, Kx lines, are provided that are buffered and traverse directionally in ¼ IC lengths from the top down, bottom up, and midsection both up and down. Kx lines can be sourced from carry signals, IOBs, interconnects, or from an edge clock and supply to clock lines, longlines, or interconnect lines. Kx lines allow vertical signal displacement, e.g., for clock signals, etc., within the chip.

In accordance with one embodiment of the present invention, an edge clock is directly coupled to an edge clock distribution system along the edges of the IC to supply an edge clock signal (e.g., a substantially undelayed signal) to an entire edge or half of an edge of the IC with less delay relative to the deskewed clock. Also, a super fast edge clock is provided for very high speed circuit requirements. In yet other embodiments, horizontal channels are disposed at the ¾, ½ and ¼ points within the IC to provide the signal distribution mechanisms for the columns of CLBs and IOBs.

DETAILED DESCRIPTION OF THE INVENTION

Figure 1A:
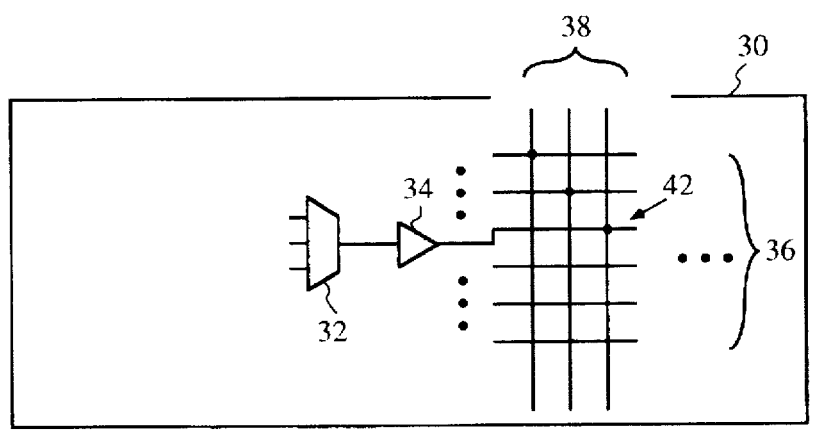
FIG. 1A illustrates a prior art column deskewed clock distribution system distributed across an entire column length.
Figure 1B:
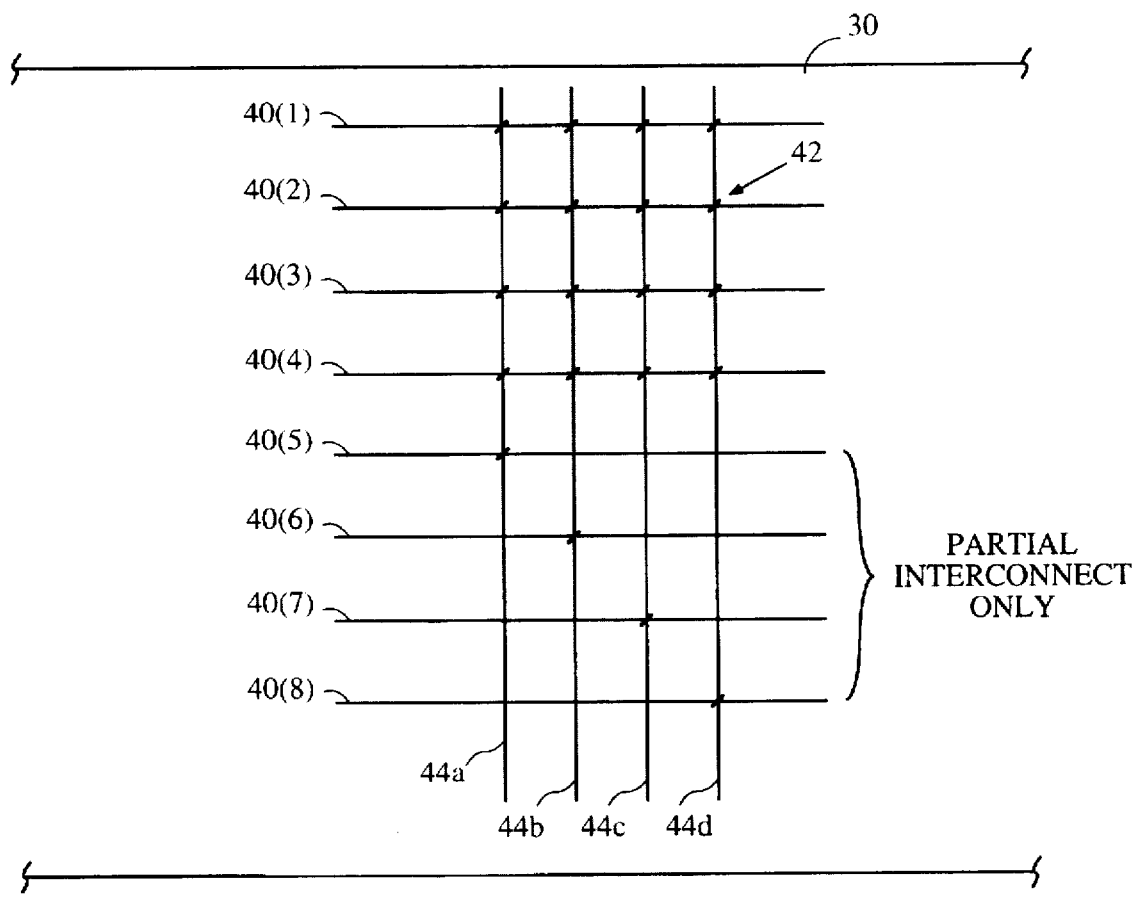
FIG. 1B illustrates a prior art column clock distribution interconnection where only four of eight supply lines are programmably coupled to the column distribution lines.
Figure 2A:
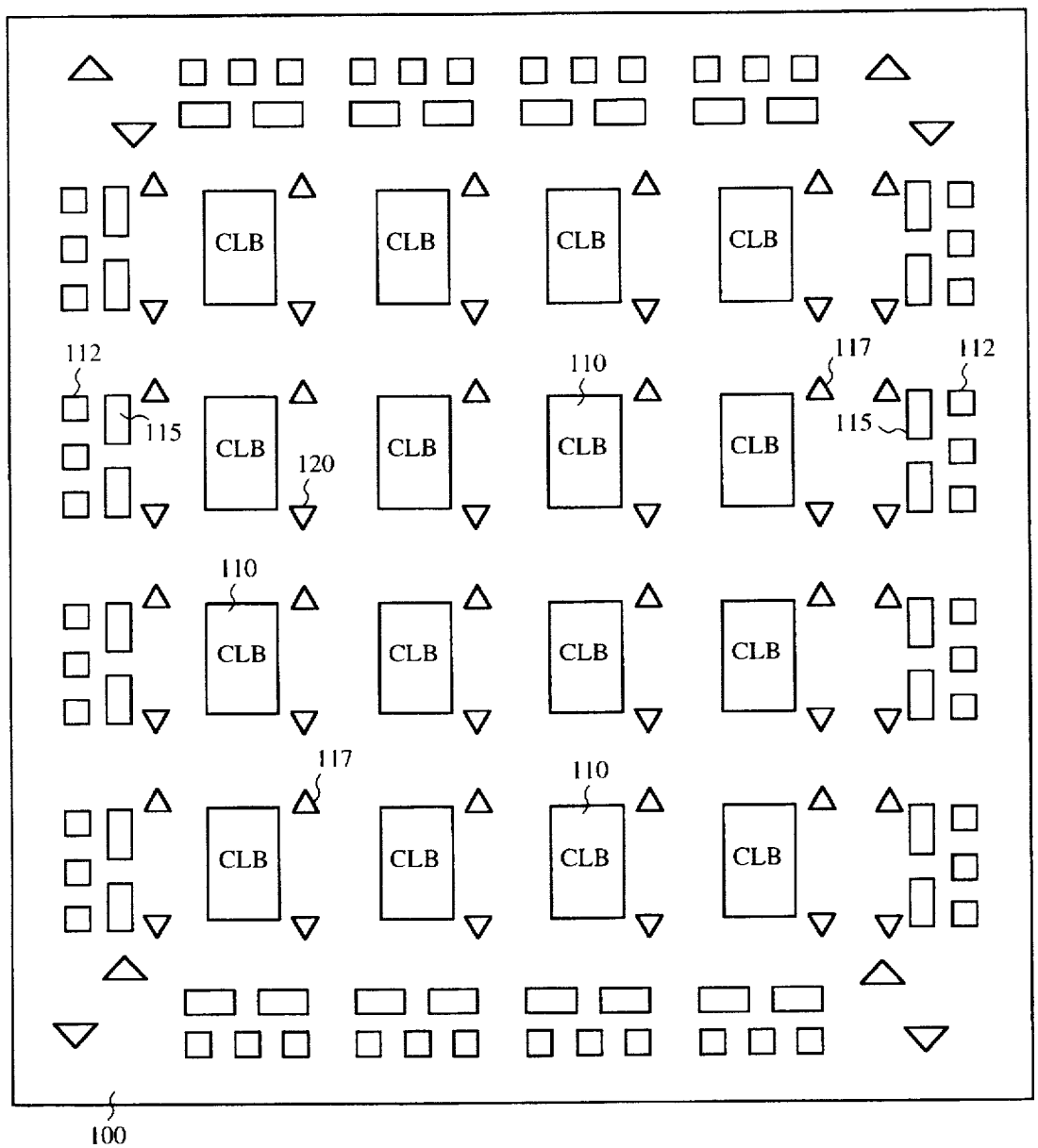
FIG. 2A illustrates a programmable integrated circuit layout in accordance with an embodiment of the present invention wherein CLBs are arranged in columns.

FIG. 2A illustrates a programmable integrated circuit (IC), such as an FPGA, in accordance with one embodiment of the present invention. The FPGA 100 contains a number of configurable logic blocks or circuits (CLBs) 110 arranged in columns and rows to form an array. Note that the number of CLBs 110 in the array shown is exemplary and the present invention is well suited for CLB arrays of variable size. One typical array includes 36×36 CLBs 110. Surrounding the CLBs 110 along the edges of the FPGA 100 are input/output blocks (IOBs) 115. The IOBs 115 are coupled to IC pads (not shown) which are coupled to external pins (not shown) for receiving and outputting signals. Also along the edge can optionally be placed decoder circuits 112. Various buffers 120 and 117 are also included within the FPGA 100.

Figure 2B:
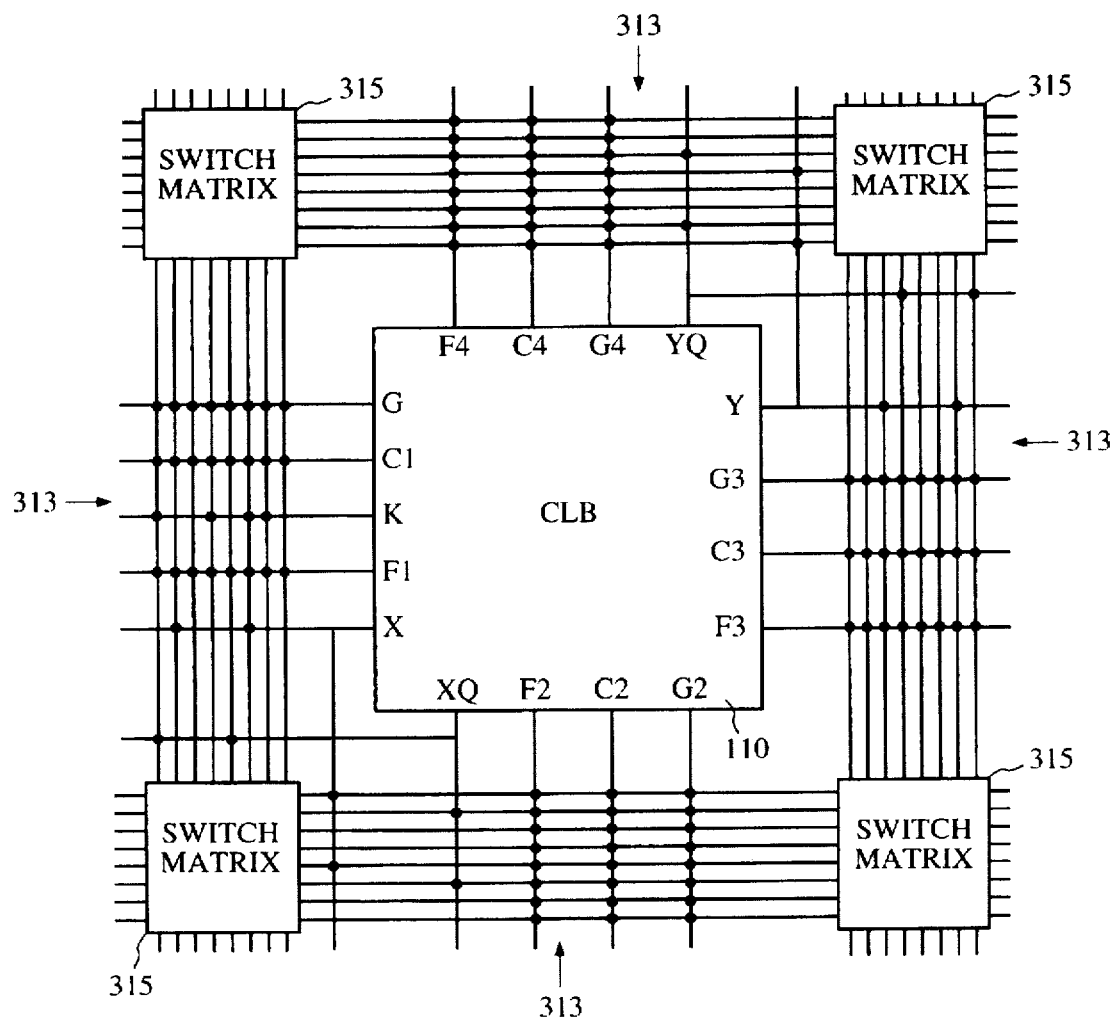
FIG. 2B illustrates an exemplary portion of the local interconnect structure used by an embodiment of the present invention.

A programmable interconnect structure, a portion of which is shown in FIG. 2B, is provided within FPGA 100 of FIG. 2A surrounding the CLBs 110. The interconnect structure allows programmable interconnection between CLBs, between IOBs, and between CLBs and IOBs. Longlines (not shown), another type of line within the interconnect structure, run substantially the dimensions of the FPGA 100. These longlines typically provide signals (e.g., global signals) required by many devices and have programmable interconnect points disposed thereon. The interconnect structure further includes a local interconnect 313, a portion of which is shown in FIG. 2B. The local interconnect 313 provides programmable connection between the input and output terminals of close or adjacent CLBs 110 or IOBs 115 (FIG. 2A). Local interconnect 313 also provides interconnection between the longlines (not shown). Switch matrices 315 are provided in the local interconnect 313 so that any signal entering the matrix 315 can be programmably coupled to many other signals entering the matrix 315 using programmable interconnect points (PIPs), (explained in detail in reference to FIG. 5B).

Figure 3:
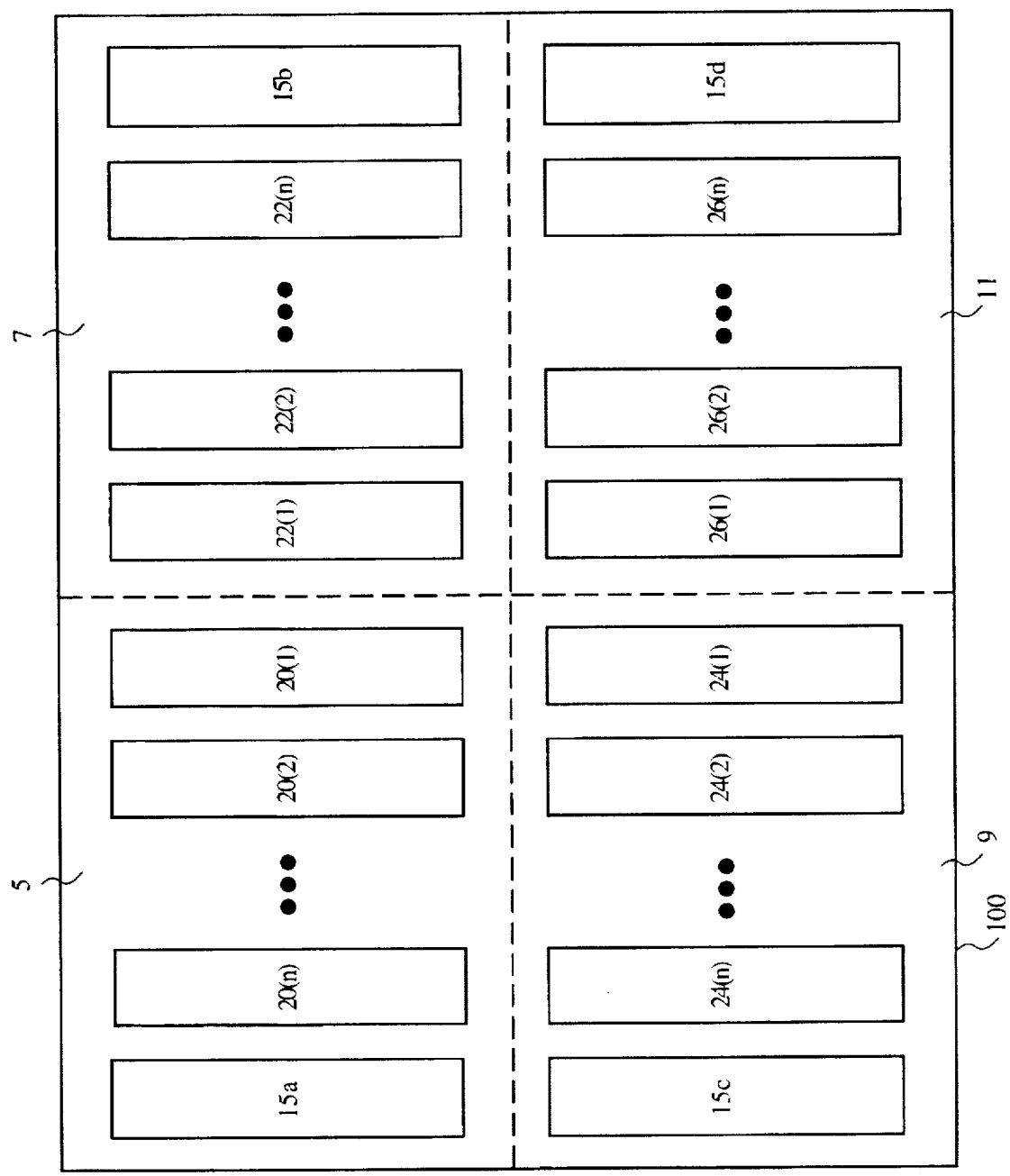
FIG. 3 illustrates a column signal distribution system in accordance with an embodiment of the present invention wherein the IC is divided into four quadrants.

With reference to FIG. 3, the FPGA 100 of the present invention is divided into four quadrants, 5, 7, 9, and 11. Quadrant 5 includes edge circuit 15a and 20(1)–20(n); quadrant 7 includes edge circuit 15b and 22(1)–22(h); quadrant 9 includes edge circuitry 15c and 24(1)–24(n); and quadrant 11 includes edge circuitry 15d and 26(1)–26(n). As described in detail below, for the deskewed clock, the signals are distributed from the pads via IOBs 115 (FIG. 2A) to the center of the FPGA 100. The signals are then buffered and fed from a central line to each column quadrant. For example, for quadrant 5, the clock signals are transferred to the center of FPGA 100, then consecutively to columns 20(1), 20(2), column 20(3), . . . , 20(n). In this way, the clock distribution network of the present invention is deskewed in the column distribution circuitry.

Edge Clock Distribution

As described below, a less-delayed edge clock is supplied by edge clock distribution circuitry 15a–15d. In this way, an entire quadrant edge can be clocked by a less-delayed clock. The edge circuitry 15a–15d supply signals (e.g., clocking signals) to the IOBs 115 (FIG. 2A) located in the periphery of the FPGA 100. Note that an "edge clock" refers to a less-delayed clock signal than the global deskew networks that is not deskewed by the global deskew networks of the present invention. Note that the column distribution circuitry, e.g., 20(1)-20(n); 22(1)–22(n); 24(1)–24(n); and 26(1)–26(n), provides a slower or more delayed deskewed signal, whereas edge clock distribution circuitry, 15a–d, typically provides a less-delayed or edge signal, but can also be used to supply the deskewed signals.

Figure 4A:
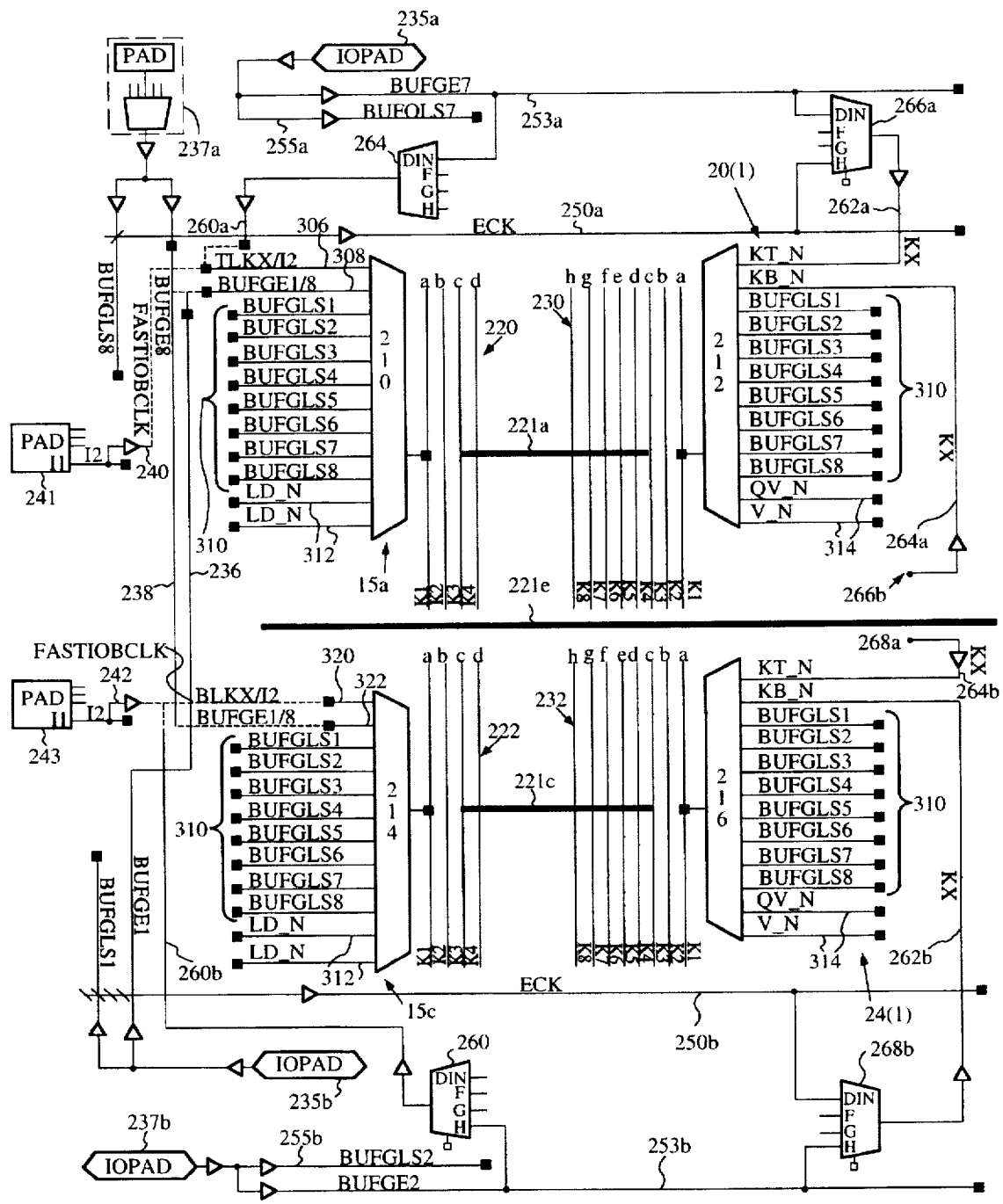
FIG. 4A illustrates a signal distribution system for a left half of the IC of FIG. 3 and illustrates a deskewed and edge clock distribution network of the present invention and Kx lines.

With reference to FIG. 4A, an edge supply multiplexer circuit (mux) 210 and edge clock distribution lines 220a–220d make up a portion of edge circuitry 15a (not shown) of quadrant 5. Edge clock distribution lines 220a–220d run the length of circuitry 15a (not shown) and supply signals to IOBs (not shown). Mux 210 supplies a signal for line 220a and is exemplary, i.e. there is an individual mux for each line 220a–220d (explained in detail in reference to FIG. 7). Mux 210 receives eight global clock supply lines 310, (received from global clock buffers) over ¾ channel 221a and also receives two input lines 312 from local interconnect 313 (FIG. 2B). As represented by mux 210, individual multiplexer circuits of the circuits that supply edge clock distribution lines 220a–220d also receive inputs 306 (an edge located Kx line 260a) from mux 264 and a very fast input from pad 241 over line 240. Mux 210 receives inputs 308 from certain early clocks (e.g., lines 238 and 236. The dashed lines indicate that only one of the two possible connections is made to mux 210. Each mux 210 has a different set of connections 306 and 308 as well as different connections 312 to the local lines). The horizontal supply lines and the multiplexer circuits of the circuits that supply the edge clock distribution lines 220a–220d are located within the ¾ channel 221a which is ¼ the length of FPGA 100 from the top.

In accordance with the present invention, the edge clock distribution circuit 15a can supply to the IOBs 115 of quadrant 5: edge clocks, signals from edge located Kx lines, signals from the local interconnect, signals from a very fast clock, and deskewed signals from lines 310.

A similar circuit 15c is provided for quadrant 9. Edge supply mux 214 of FIG. 4A and edge clock distribution lines 222a–222d make up a portion of edge circuit 15c (not shown). Lines 222a–222d run the length of circuit 15c and supply signals to IOBs. Mux 214 supplies a signal for line 222a and is exemplary as there is an individual mux for each edge clock distribution line 222a–222d. Mux 214 receives eight global clock supply lines 310, (received from global clock buffers) from ¼ channel 221c and also receives two inputs 312 from local interconnect 313 (FIG. 2B). As represented by mux 214, individual multiplexer circuits of the circuits that supply edge clock distribution lines 222a–222d also receive inputs 320 (an edge located Kx line 260b) from mux 260 and one from pad 243 over line 242. Mux 214 receives inputs 322 from certain early clocks (e.g., lines 238 and 236. The dashed lines indicate that only one of the two possible connections are made in the mux 214. Each mux 214 has a different set of connections 320, 322 as well as different connections 312 to the local lines). The multiplexer circuits of the circuits that supply edge clock distribution lines 222a–222d are located within the ¼ channel 221c ¼ the length of the FPGA 100 from the bottom.

In accordance with the present invention, the edge clock distribution circuit 15c can supply to the IOBs 115 of quadrant 9 the following signals: edge clocks, signals from edge located Kx lines, signals from the local interconnect, signals from a very fast clock, and deskewed signals from lines 310.

Edge clock supply lines 238 and 236 supply edge clock signals within the edge clock distribution network of circuits 15a and 15c. Since these signal lines do not pass through the global deskew network, e.g., 20(1)–20(n), they are not substantially delayed within respect to the signals seen over the input pads (e.g., 237a and 235b) (Note that in one embodiment the pads herein referenced, as shown by pad 237a, include a multiplexer which receives at least one input signal from a chip pad and at least one other signal from another source, such as the general interconnect). This edge clock is then supplied to IOBs 115 through edge clock distribution lines 220a–b and/or 222a–b. In this way, IOBs 115 can access a non-delayed clock signal as well as a deskewed clock signal (from lines 310).

In accordance with the present invention, an edge clock signal over lines 238 or 236 can be supplied uniformly to IOBs 115 along the entire left edge of FPGA 100 or within the top or bottom edge. Using edge clock line 236, circuit 15c individually or circuit 15a, or both, can supply an edge clock (from pad 235b) to their respective IOBs 115. Using signal 238, circuit 15c individually or circuit 15a, or both, can supply an edge clock (from pad 237a) to their respective IOBs 115.

Input 241 and 243 of FIG. 4A each supply a separate signal over lines 240 and 242 which can be routed to the edge clock distribution networks of circuits 15a and 15c. These lines carry a clock signal directly from the adjacent pad to the edge supply muxes of circuits 15a and 15c (e.g., 210 and 214) which are coupled to IOB 115. Due to the direct path and short length of these lines, relative to the signal seen at the pad, the signal associated with these lines has less delay compared to the edge clocks 236 and 238. This signal is well suited for high speed applications where signal delay must be kept to a minimum. This is called the super fast edge clock.

Mux 264 of FIG. 4A selects from a number of signals (see FIG. 8D), one of which is an edge clock 253a, and supplies this signal over a Kx line 260a to the edge supply muxes of circuit 15a. Line 260a is directional and runs ¼ of length of FPGA 100 from the top down to the ¾ channel 221a to the edge supply muxes of circuit 15a. The Kx line 260a is useful as a clock supply line because of its fast, lightly loaded supply path from the top of the FPGA 100 to the ¾ point 221a. Using this arrangement, the present invention allows a source from mux 264 to clock the IOBs 115 along the top left edge of FPGA 100.

Mux 260 of FIG. 4A selects a number of signals, one of which is an edge clock 253b, and supplies this signal over a Kx line 260b to the edge supply muxes of circuit 15c. Directional line 260b runs ¼ of length of FPGA 100 from the bottom up to supply the edge supply muxes of circuit 15c of the ¼ channel 221c. The Kx line is useful as a clock supply line because of its fast lightly loaded supply path from the bottom of the FPGA 100 to the ¼ point 221c. Using this arrangement, the present invention allows a source from mux 260 to clock the IOBs 115 along the bottom left edge of FPGA 100.

Line 253a and line 253b run horizontally along the top and bottom, respectively, of the FPGA 100 over ½ of the width of the device. These lines are useful for distributing a clock signal horizontally along the upper and lower halves of FPGA 100. Two separate edge clocks can be supplied horizontally along these lines (originating from pads 235a and 237b, respectively). Although only one column is shown, lines 253a and 250a couple to the mux 266a of each column. Lines 250a and 250b similarly run horizontally along the top and bottom half width of the FPGA 100 and can be used to horizontally supply two separate edge clocks (originating from pads 237a and 235b, respectively). Although only one column is shown, lines 253b and 250b couple to the mux 268b of each column.

Deskewed Column Distribution

FIG. 4A also illustrates the global deskewed clock distribution network of the present invention for quadrants 5 and 9 including column circuitry for exemplary columns 20(1) and 24(1). Column supply mux 212 of circuit 20(1) receives global clock supply lines 310 and also receives a top Kx line 262a and also another Kx line 264a. Mux 212 also receives two inputs 314 from local interconnect. Mux 212 supplies a signal to column distribution line 230a. Column distribution lines 230a–h run substantially the length of column circuit 20(1). A separate mux (see FIG. 6) is provided for each column distribution line of 230a–h. The column distribution lines 230a–h and the associated column supply muxes 212 for these lines comprise most of the circuitry of column circuit 20(1) of FIG. 3. The column supply muxes and horizontal supply lines for the columns of quadrant 5 lie within the ¾ channel 221a. The entire clock distribution circuit 20(1) as shown in FIG. 4A is replicated for each column (e.g., for 20(2) to 20(n)) in a deskewed network to supply the deskewed signals.

Since the columns within circuits 20(1)–20(n) are only half of the length of the FPGA 100, the resistance and capacitance associated with the column distribution lines 230a–h is half that of the prior art. In this manner, the deskewed clock signals arrive with less delay relative to the input signal seen at the pad. However, since the columns are half of the full length, a second column is provided in the lower quadrant 9 (e.g., within circuit 24(1)) to supply signals to this portion of FPGA 100. The global clock signals 310 are distributed from the vertical middle of the FPGA 100 and span outward within channel 221a toward the left side of FIG. 4A to supply the column supply muxes for each column of 20(2)–20(n). The output of the mux 212 is therefore a deskewed signal and is supplied to the CLBs 110 of column 20(1).

In quadrant 9, column supply mux 216 of circuit 24(1) of FIG. 4A receives global clock supply lines 310 and also receives a bottom Kx line 262b and another Kx line 264b. Mux 216 also receives two inputs 314 from local interconnect. Mux 216 supplies a signal to column distribution line 232a. A separate mux is provided for each column distribution line of 232a–h. The column distribution lines 232a–h run substantially the length of column circuit 24(1). The column distribution lines 232a–h and the associated supply muxes 216 for these lines comprise most of the circuitry of column circuit 24(1) of FIG. 3. The supply muxes (216) and supply lines for the columns of quadrant 9 lie within the ¼ channel 221c. The entire clock distribution circuit 24(1) as shown in FIG. 4A is replicated for each column 24(2) to 24(n) in a deskewed network to supply the deskewed signals.

Since the columns within circuits 24(1)–24(n) are only half of the length of the FPGA 100, the resistance and capacitance associated with the column lines 232a–h is half relative to the prior art full FPGA length design. This allows the deskewed clock to arrive with less delay relative to the input signal seen at the pad. The global clock signals 310 are distributed from the middle of the FPGA 100 and span outward within channel 221c toward the left side of FIG. 4A to supply the supply muxes for each column of 24(1)–24(n). The output of the supply mux 216 is therefore a deskewed signal and is supplied to CLBs of column 24(1).

Line 262a of FIG. 4A is a Kx line originating from mux 266a which selects from a number of different signals (see FIG. 8A), among which two are edge clocks 253a and 250a. Kx line 262a of the present invention is directional and runs from the top of FPGA 100 down ¼ length to the ¾ channel 221a where it interfaces with each supply mux 212 that supplies to the column distribution lines 230a–h. The Kx line 262a is well suited to supply clock signals to the columns because it runs substantially without interference over ¼ length of the device. Similarly, line 262b is a Kx line originating from mux 268b which selects from a number of different signals (including from the local interconnect or from IOBs), among which two are edge clocks 250b and 253b. Kx line 262b is directional and runs from the bottom of FPGA 100 up ¼ length to the ¼ channel 221c where it interfaces with each mux 216 that supplies to the column distribution lines 232a–h of quadrant 9. The Kx line 262b is well suited to supply clock signals to the columns because it runs substantially without interference over ¼ length of the device.

The Kx line 264a of FIG. 4A originates from a mux 266b (not shown) which lies within the ½ channel 221e. The mux 266b of the present invention selects from a number of sources (see FIG. 8), including the local interconnect to supply a signal along this directional line from the ½ point 221e to the ¾ point 221a where supply mux 212 is located. Similarly, Kx line 264b originates from a mux 268a (not shown) which lies within the ½ channel 221e. The mux 268a selects from a number of sources, including the local interconnect, to supply a signal along this directional line from the ½ point 221e to the ¼ point channel 221c where supply mux 216 is located. Since the Kx lines 264a and 264b run substantially uninterrupted, they are well suited for clock supply lines.

Mux 266a and 268b along with Kx lines 262a and 262b and 264a and 264b are part of the column circuitry 20(1) and 24(1) and are replicated for each column of quadrants 5 and 9.

Figure 4B:
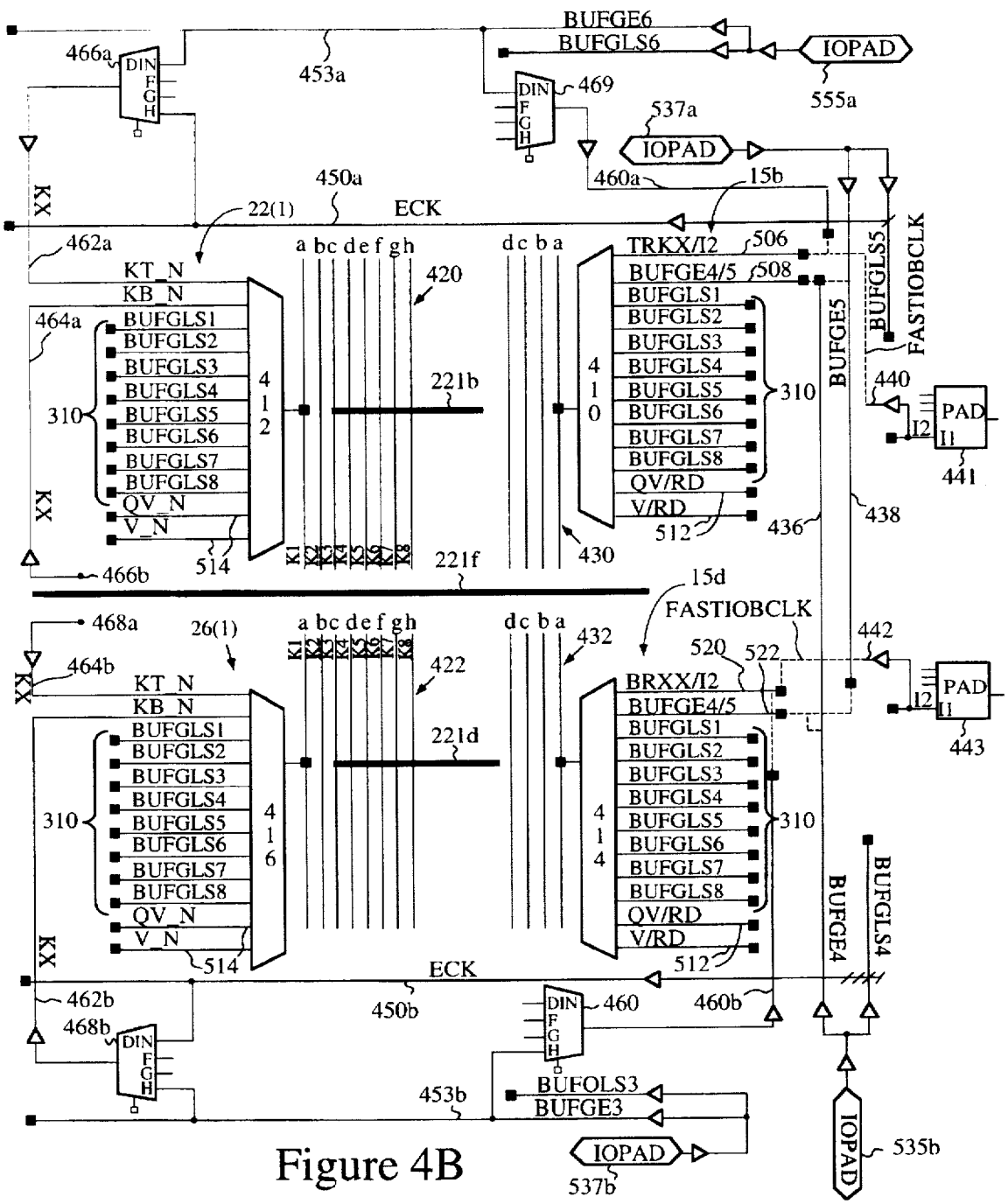
FIG. 4B illustrates a signal distribution system for a right half of the IC of FIG. 3 and illustrates a deskewed and edge clock distribution network of the present invention and Kx lines.

FIG. 4B illustrates the circuitry for quadrants 7 and 11 of FIG. 3 of the present invention. Like numbers represent like structure. The components of FIG. 4B are analogous to those of FIG. 4A except the edge of FIG. 4B is along the right side. Within FIG. 4B exemplary columns 22(1) and 26(1) are shown along with edge circuits 15b and 15d.

Column supply mux 412 of circuit 22(1) of quadrant 7 couples to column distribution line 420a and a separate supply mux is coupled to each column distribution line of 420a–h. Lines 514 originate from local interconnect. This arrangement, as in quadrant 5, is duplicated for each column of 22(1)–22(n). In quadrant 11, supply mux 416 of circuit 26(1) couples to column distribution line 422a and a separate supply mux is coupled to each line of 422a–h. Lines 514 originate from local interconnect. This circuit is duplicated for each column of 26(1)–26(n) in quadrant 9.

Similar to FIG. 4A, a portion of edge circuit 15b comprises edge supply mux 410 and edge clock distribution lines 430a–d of FIG. 4B. Supply mux 410 is coupled to line 430a and a duplicate mux is provided for each edge clock distribution line 430a–d. Lines 512 originate from local interconnect. A portion of edge circuit 15d comprises supply mux 414 and edge clock distribution lines 432a–d. Supply mux 414 is coupled to line 432a and a duplicate mux is provided for each distribution line 432a–d. Lines 512 originate from local interconnect.

Similar to FIG. 4A, the column circuitry 22(1) and 26(1) contain Kx lines 462a, 464a, 464b, and 462b and associated muxes. These are replicated for each column in quadrants 9 and 11. Also, the edge circuitry 15b and 15d utilize Kx lines 460a and 460b and associated muxes.

Circuits 441 and 443 of FIG. 4B are analogous to circuits 241 and 243 of FIG. 4A and supply a super fast clock to the edge clock distribution circuits 15b and 15d. Kx supply muxes 464, 460, 466a and 468b (FIG. 4B) are analogous to muxes 264, 260, and 266a, 268b (FIG. 4A), respectively. Likewise, edge clock distribution line 438 (coupling to pad 537a) and line 436 (coupling to pad 535b) of FIG. 4B are analogous to lines 238 and 236 (FIG. 4A). Edge clock distribution lines 453a (coupled to pad 555a), 450a–, 450b, and 453b (coupled to pad 537b) of FIG. 4B are analogous to lines 253a, 250a–, 250b, and 253b (FIG. 4A). Column Kx lines 462a, 464a, 464b and 462b (FIG. 4B) are analogous to Kx lines 262a, 264a, 264b, and 262b (FIG. 4A). Edge Kx lines 460a and 460b (FIG. 4B) are analogous to Kx lines 260a and 260b (FIG. 4A). Mux 466d in ½ channel 221f supplies Kx line 464a and mux 468a in ½ channel 221f supplies Kx line 464b. For quadrants 7 and 11, analogous structures function in the analogous manner as described with respect to FIG. 4A.

FIG. 4B illustrates the ¾ channel 221b, the ¼ channel 221d and the ½ channel 221f for quadrants 7 and 11. Similarly to the circuitry of FIG. 4A, the buffering and multiplexing for the column and edge clock distribution networks are located in the channel segments.

Using the distribution network structure of FIG. 4A and FIG. 4B, the present invention is able to provide an improved global deskew network to the column circuitry with ½ the resistance and capacitance over the prior art while providing edge clocking to the edge circuits of the FPGA 100. The present invention allows additional flexibility in that a new signal line, the Kx, line can be used as an additional clock source throughout the column circuits. Another feature of edge clock 238 in conjunction with edge clock 250a is to provide a low-skew clock to a predetermined quadrant that has less delay than the global deskewed clock. By coupling edge clock 238 and edge clock 250a with clock input 237a, the entire quadrant (selected by the user) can operate with a fast low-skew clock. Each quadrant can be operated in a similar manner. Note that as described herein, the most delayed signal from the input clock source is the BUFGLS signal (a global, low skew signal). The edge clock signals BUFGE and ECK (250a) are faster than the BUFGLS signal, wherein the fastest clock signal is provided on line 240 (FASTIOBCLK).

Figure 5A:
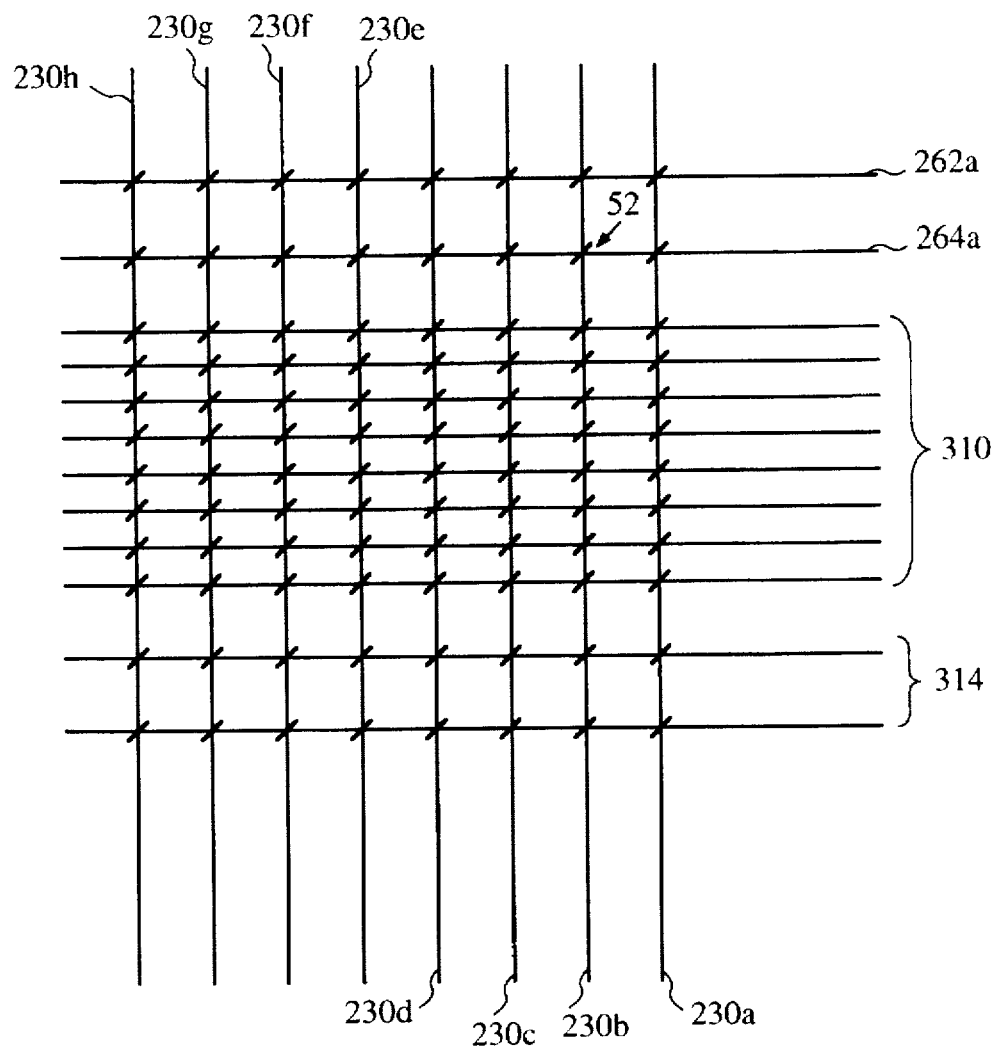
FIG. 5A illustrates a circuit schematic of a programmable connection structure of the present invention wherein any of at least eight column signal lines can couple with any signal supply line of at least eight horizontal supply lines.

FIG. 5A illustrates an exemplary circuit schematic of the multiplexing interconnection structure for a column distribution circuit. Specifically, the circuitry of 20(1) is shown in schematic detail. Horizontally, there are eight supply lines within the global distribution lines 310 (which originate from buffers near the clock pads in the corner. These buffers can be sourced from the clock pads or general interconnect pads). Two horizontal interconnect lines 314 are shown and two Kx lines 262a and 264a are shown. Vertically, there are eight column distribution lines 230a–h. Note that the present invention is well suited to operate with more or fewer lines, and the mux can operate with more or fewer input lines.

Figure 5B:
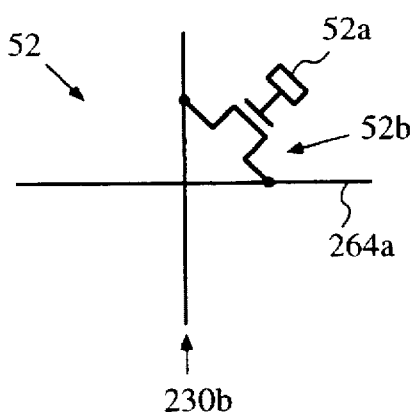
FIG. 5B illustrates a circuit schematic of a PIP used by the present invention.

With reference to FIG. 5A, at the cross point of each line is located a programmable interconnect point or (PIP), an exemplary PIP 52 is shown at the cross point of lines 230b and 264a. FIG. 5B illustrates that a PIP 52 is comprised of a pass transistor 52b and a programmable memory cell or device 52a (e.g., SRAM, DRAM, Flash, PROM, antifuse material, etc.) for controlling the gate of transistor 52b. The pass transistor 52b couples to two interconnecting lines, here line 264a and 230b when programmed ON and does not couple the lines when programmed OFF. It is appreciated that the terms multiplexer, or mux, or multiplexer circuits, or demultiplexer, or demux, are interpreted to cover the PIP arrangements as shown in FIG. 5A.

With reference to FIGS. 4A and 5A, supply mux 212 is represented as the arrangement of PIPs (12 in this embodiment) along line 230a at the cross points of horizontal supply lines 314, 310, 264a, and 262a. Within the present invention, any of the horizontal supply lines can be coupled to line 230a. As described above, mux 212 is replicated for each column distribution line 230a–230h as shown by the PIP arrangements associated with each column distribution line 230a–230h. With the overall arrangement of FIG. 5A, any horizontal supply line can be coupled to any vertical column distribution line. Further any of the eight horizontal global clock supply lines 310 can be coupled to any of the eight vertical column distribution lines 230a–h. The coupling at any particular point is performed by programming the memory cell 52a associated with the pertinent PIP at the cross points of the lines.

Figure 6:
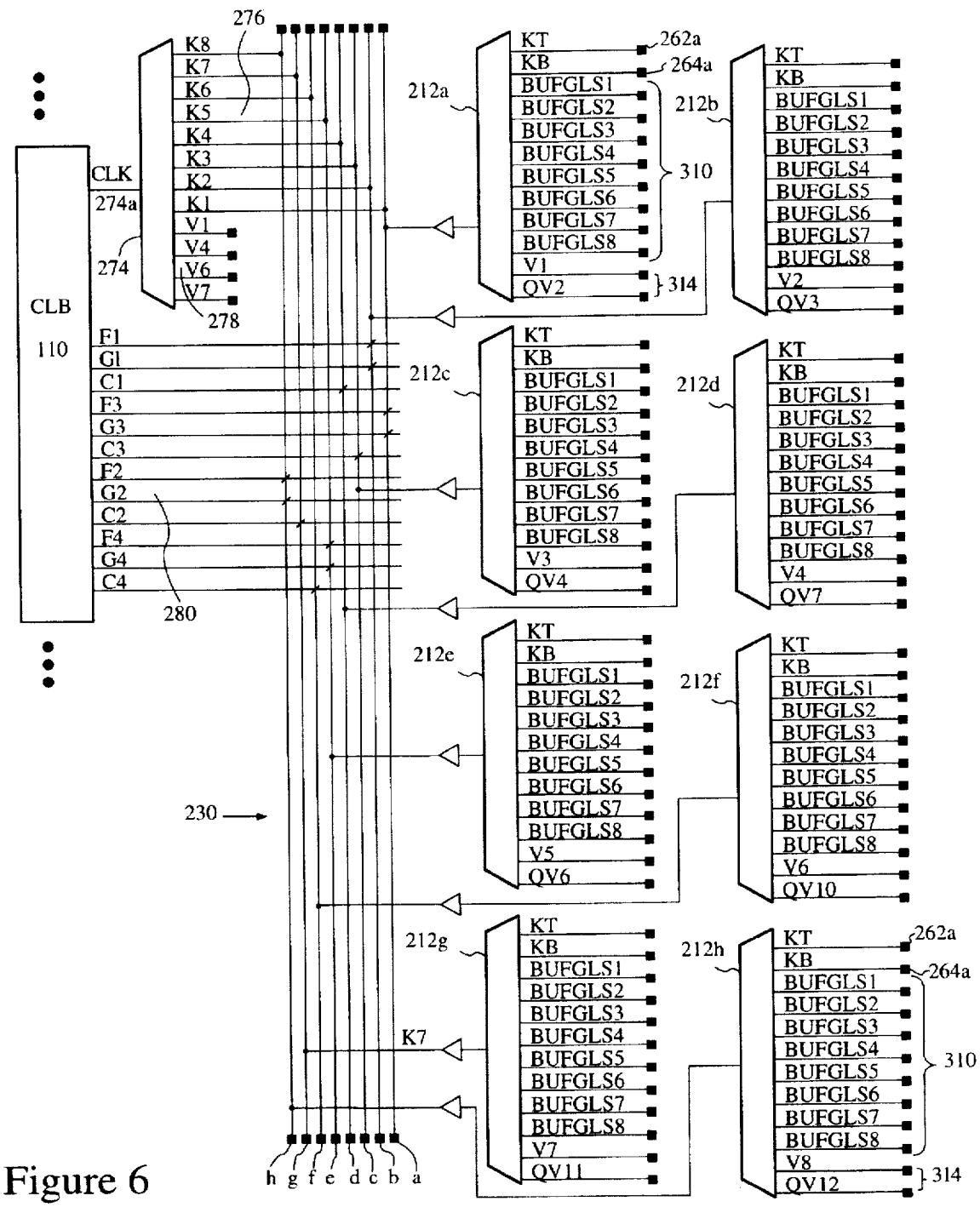
FIG. 6 is a logical schematic of a column signal distribution network used by each column of the IC of the present invention.

FIG. 6 illustrates a more extensive logical circuit diagram of the circuit of FIG. 5A which corresponds to the column circuitry 20(1) as shown in FIG. 4A. The eight multiplexing supply circuits 212a–212h are shown, one for each column distribution line, and are coupled individually to column distribution lines 230a–230h, respectively. Ten inputs to the supply muxes 212a–h are all the same for each supply mux and include lines 262a, 264a, and lines 310. Regarding lines 314, the connections to the local lines are different for each mux, allowing different local lines to drive different clock lines. Also shown, is one exemplary CLB 110 of the column circuit 20(1). Many more CLBs exist within a single column. The clock input mux 274 for CLB 110 can select any line of the column distribution lines 230a–h as well as from a number of interconnect lines 278 to supply clock signal 274a. Other inputs 280 of CLB 110 can be programmably coupled to individual column distribution lines 230a–h using a PIP arrangement as shown. The output of each supply mux can be buffered.

It is appreciated that the circuit of FIG. 6 is replicated for each column 20(1)–20(n) of quadrant 5. The supply muxes 212a–h and horizontal supply lines being routed in the ¾ channel 221a. The circuit of FIG. 6 is also similar to the column distribution circuits of the other quadrants 7, 9, and 11, and similarly for these quadrants the circuit is replicated for each column and disposed within the pertinent channel.

Figure 7:
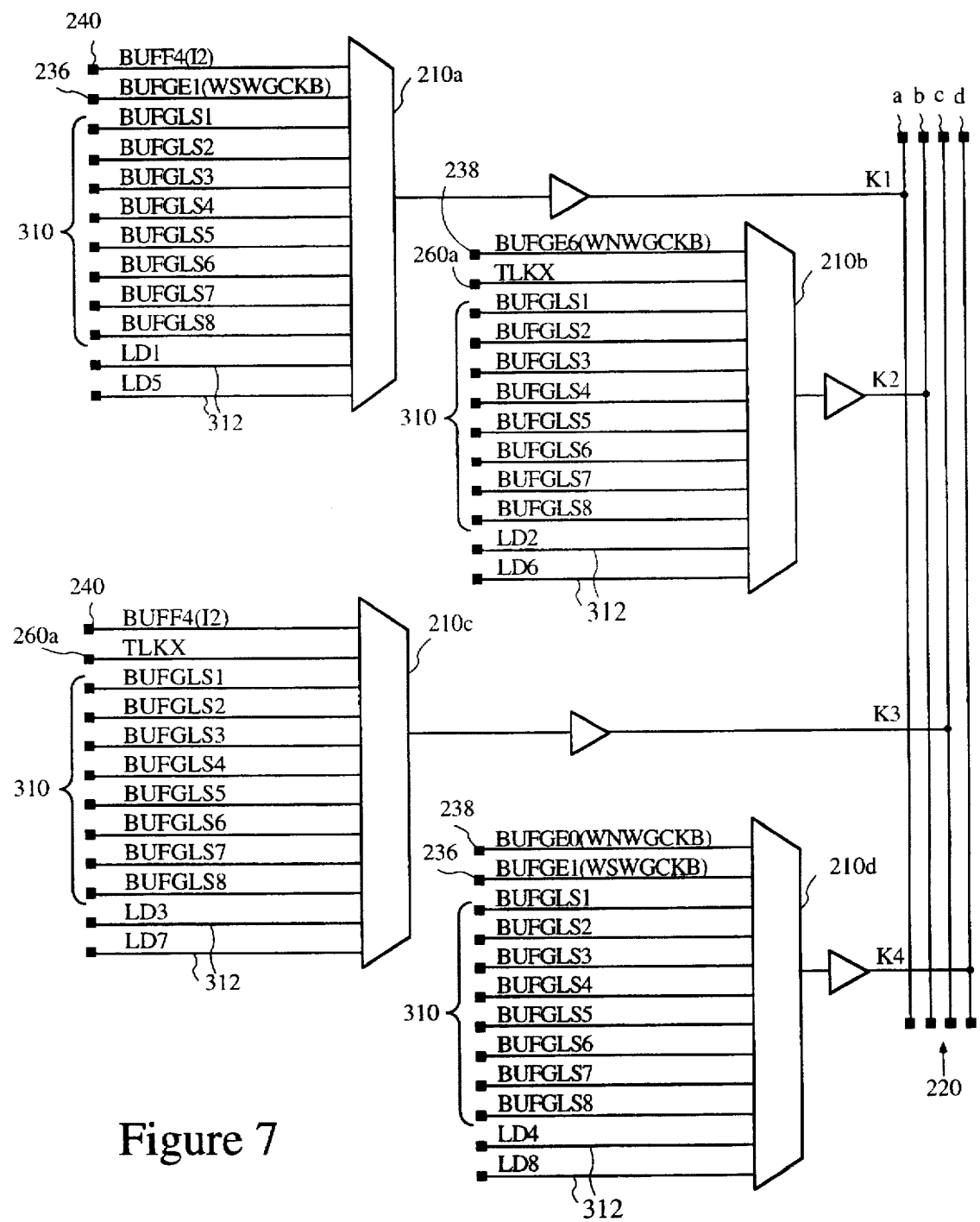
FIG. 7 is a logical schematic of an edge signal distribution network used by edge circuits, e.g., IOBs, of the present invention.

FIG. 7 illustrates a more extensive logical schematic of an edge clock distribution circuit as shown in FIG. 4A corresponding to circuit 15a. Four supply multiplexers 210a–210d are shown and are individually coupled to edge clock distribution lines 220a–d. The inputs to the muxes are different. Each supply mux 210a–210d receives the eight deskewed signals 310 and two interconnect signals 312. The interconnect signals are different for each mux. Mux 210a also receives signal 240 (from the super fast clock input 241) and signal 236 which is an edge clock. Supply mux 210b also receives signal 238 (an edge clock) and signal 260a which is an edge Kx line. Supply mux 210c also receives signal 240 (from the super fast clock input 241) and signal 260a which is an edge Kx line. Supply mux 210d also receives signals 238 and 236 which are both edge clocks. Analogous circuitry to that of FIG. 7 is also used for edge circuits 15b–15d although the inputs to the muxes can vary. The supply muxes and horizontal supply lines of FIG. 7 exist within ¾ channel 221a. It is appreciated that the output of each mux can be buffered.

Figure 8A:
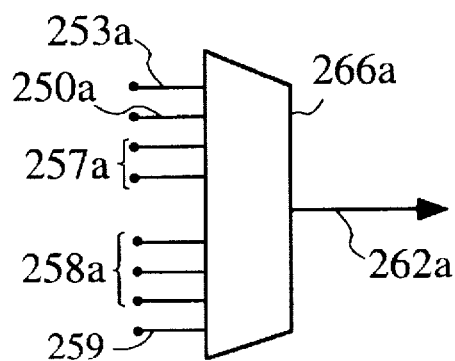
FIG. 8A illustrates a source multiplexer circuit for sourcing signals to a top originating Kx line of the present invention for column distribution.

FIG. 8A illustrates the supply lines for mux 266a of FIG. 4A. This mux 266a supplies the directional Kx line 262a which traverses from the top to the ¾ channel 221a. Mux 266a receives input 253a and 250a which can carry edge clocks and also receives two inputs 257a which are coupled to the outputs of IOBs 115. These lines 257a can also source clock signals. Lines 258a originate from the local interconnect. Lastly, line 259 is a carry out signal that is useful in supplying the column circuitry 20(1) with a carryout signal from another column, e.g., an adjacent column 20(2). It is appreciated that mux 266a is duplicated for each column 20(1)–20(n) within quadrant 5. Analogously, mux 466a of FIG. 4B contains the same source inputs as mux 266a. Mux 466a generates Kx line 462a for circuit 22(1). It is appreciated that mux 466a is duplicated for each column 22(1) –22(n) within quadrant 7.

Figure 8B:
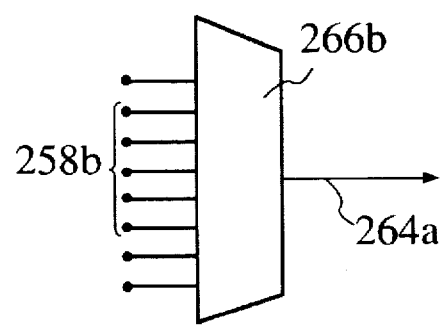
FIG. 8B illustrates a source multiplexer circuit for sourcing signals to a mid originating Kx line of the present invention for column distribution.

FIG. 8B represents mux 266b of FIG. 4A which generates the Kx line 264a which originates from the ½ channel 221e and traverses up to the ¾ channel 221a to supply to the column distribution circuit 20(1). In this embodiment, mux 266b does not receive edge inputs nor IOB inputs due to its middle location. Mux 266b does receive inputs from the local interconnect over lines 258b. Mux 268a of FIG. 4A is analogous to mux 266b. Mux 268a generates Kx line 264b from the ½ channel 221e to the ¼ channel 221c for channel distribution circuit 24(1). It is appreciated that mux 266b is duplicated for each column circuit 20(1)–20(n) in quadrant 5 and mux 268a is duplicated for each column circuit 24(1)–24(n) in quadrant 9. Analogous circuits 466b and 468a of FIG. 4B input the same source signals from the local interconnect and are replicated for each channel circuit 22(1) to 22(n) and 26(1) to 26(n), respectively.

Figure 8C:
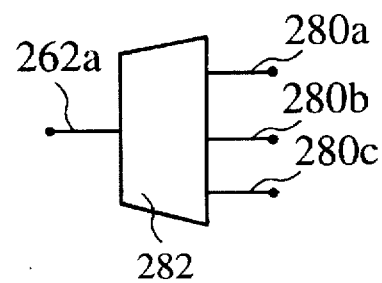
FIG. 8C illustrates a destination demultiplexer for supplying signals from a Kx line.

FIG. 8C illustrates the demultiplexing circuit 282 associated with Kx line 262a of the present invention as shown in FIG. 4A. It is appreciated that demux circuit 282 can be implemented as an arrangement of PIPs (e.g. as shown in FIG. 5). In this embodiment, more than one output signal can be driven by the Kx line. Although Kx line 262a is shown directly coupled to mux 212, in one embodiment, the Kx line is routed to a demultiplexing circuit before coupling to the column distribution circuit. In the ¾ channel 221a, the Kx line 262a is demultiplexed by circuit 282 and can be supplied over line 280a for clocking, which is coupled to the input of supply mux 212 or can be supplied over line 280b which is coupled to a long line interconnect for distribution to other circuitry of the column. Lastly, Kx line 262a can be routed to line 280c which represents the local interconnect. It is appreciated that demux circuit 282 is replicated for each channel circuit 20(1)–20(n) of quadrant 5 and also for each channel circuit 22(1)–22(n) for quadrant 7. A similar demux circuit (located in the ¼ channel 221c) is provided for Kx line 262b and is replicated for each channel circuit 24(1) –24(n) of quadrant 9 and also for each channel circuit 26(1)–26(n) for quadrant 11.

Figure 8D:
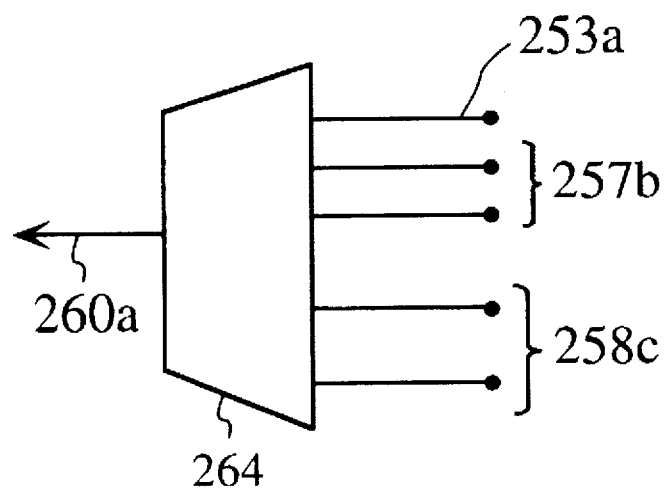
FIG. 8D illustrates a source multiplexer circuit for sourcing signals to a edge located Kx line of the present invention for edge IC distribution.

FIG. 8D illustrates the multiplexer circuit 264 of FIG. 4A of the present invention. Mux 264 supplies edge Kx line 260a within the edge clock distribution circuit 15a. Line 260a originates at the top edge of FPGA 100 and traverses to the ¾ channel 221a. Using mux 264, edge Kx line 260a can be sourced by line 253a which is an edge clock, or by lines 257b which originate from IOBs, or by lines 258c which are from the local interconnect structure. This arrangement allows the edge Kx line 260a to provide a number of signals, including an edge clock. It is appreciated that circuit 264 (quadrant 5) operates analogous to circuit 260 (quadrant 9) as does circuit 464 (quadrant 7) and circuit 460 (quadrant 11).

Figure 9:
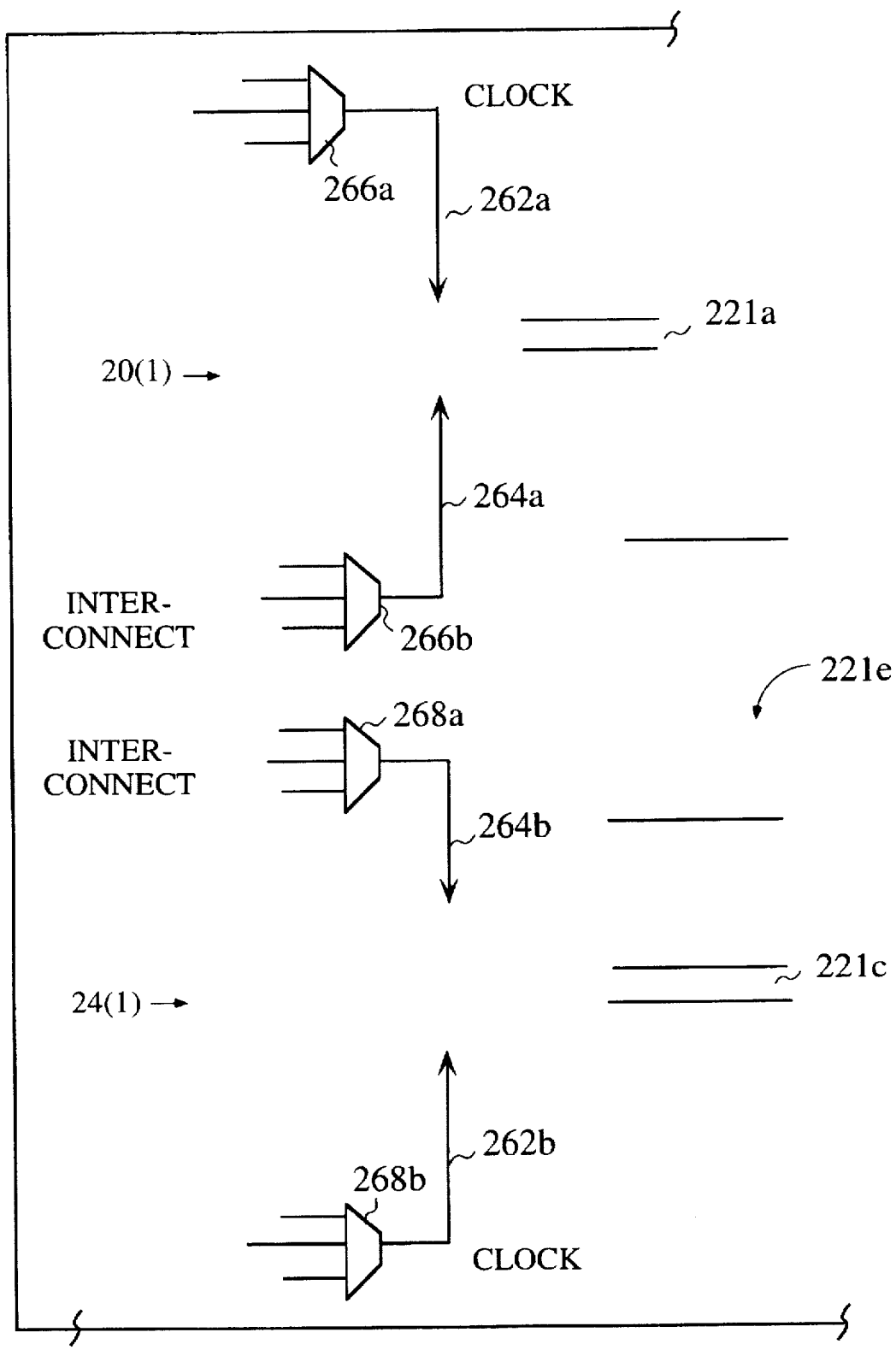
FIG. 9 illustrates an arrangement for a single column including directional Kx lines from top down ¼, from bottom up ¼, and from mid IC up and down both ¼ for signal distribution in accordance with the present invention.

FIG. 9 illustrates the Kx lines associated with column distribution circuits 20(1) and 24(1) within an FPGA 100 of the present invention. The channel widths are not shown to scale. It is appreciated that this arrangement is duplicated across each column circuit pair 20(1)/24(1) to 20(n)/24(n) and across 22(1)/26(1) to 22(n)/26(n). Mux 266a supplies Kx line 262a from the top to the ¾ channel 221a and mux 268b supplies Kx line 262b from the bottom to the ¼ channel 221c. These circuits can be used to supply a number of different signals to channel 20(1) and channel 24(1), including an edge clock, an interconnect signal, a carry signal, or any signal (e.g., clock) from an IOB. This signal is then deskewed to the CLBs by the column supply multiplexers (e.g., 212 and 216) and their associated buffers (not shown) and distribution lines 230/232. This particular arrangement is an effective and flexible mechanism for supplying more clock signals, in addition to the global signals 310, to the CLBs of the columns. The Kx lines 262a and 262b are an effective mechanism for supplying edge clocks vertically into the FPGA 100.

Alternatively, a signal received over the local interconnect can be routed within the ½ channel 221e to mux circuits 266b and 268a and can be routed to the ¼ channel 221c and to the ¾ channel 221a using Kx lines 264b or 264a, respectively. It is appreciated that each Kx line is directional with the appropriate directions illustrated by arrows within FIG. 9.

The preferred embodiment of the present invention, a clock distribution system offering an improved deskewed clock distribution network and also including edge clocks, is thus described. While the present invention has been described in particular embodiments, it should be appreciated that the present invention should not be construed as limited by such embodiments, but rather construed according to the below claims.

What is claimed is:

1. In a programmable integrated circuit, a signal distribution arrangement comprising:

a first plurality of column circuits each having a top column distribution line disposed vertically within a top half of said integrated circuit and extending lengthwise substantially one half the length of said integrated circuit, each of said first plurality of column circuits comprising a plurality of configurable logic circuits;

a second plurality of column circuits each having a bottom column distribution line disposed vertically within a bottom half of said integrated circuit and extending lengthwise substantially one half the length of said integrated circuit, each of said second plurality of column circuits comprising a plurality of configurable logic circuits; and a signal distribution network distributing a deskewed signal from a signal supplied at the center of said integrated circuit, said signal distribution network comprising:

a first multiplexer circuit coupled to a top column distribution line for supplying said deskewed signal to at least one column circuit of said first plurality of column circuits; and a second multiplexer circuit coupled to a bottom column distribution line for supplying said deskewed signal to at least one column circuit of said second plurality of column circuits.

2. A signal distribution arrangement as described in claim 1 wherein said signal distribution network further comprises:

a first plurality of multiplexer circuits coupled to each top distribution line of said first plurality of column circuits for supplying said deskewed signal to each column circuit of said first plurality of column circuits; and a second plurality of multiplexer circuits coupled to each bottom distribution line of said second plurality of column circuits for supplying said signal to each column circuit of said second plurality of column circuits.

3. A signal distribution arrangement as described in claim 2 wherein said first plurality of multiplexer circuits are disposed within a channel located ¼ length from the top of said integrated circuit, and wherein said second plurality of multiplexer circuits are disposed within a channel located ¼ length from the bottom of said integrated circuit.

4. A signal distribution arrangement as described in claim 1 further comprising a plurality of supply lines coupled to said first multiplexer and coupled to said second multiplexer wherein said first multiplexer selects one of said plurality of supply lines for coupling to said top column distribution line and wherein said second multiplexer selects one of said plurality of supply lines for coupling to said bottom column distribution line.

5. A signal distribution arrangement as described in claim 1 further comprising a signal line disposed between said center of said integrated circuit and an input/output circuit located within a periphery of said integrated circuit, said signal line for distributing said signal from said input/output circuit to said center.

6. A signal distribution arrangement as described in claim 1 wherein said deskewed signal is a clock signal.

7. In a programmable integrated circuit, an apparatus comprising:

a first column circuit having n column distribution lines disposed vertically within a top half of said programmable integrated circuit and extending lengthwise substantially one half the length of said programmable integrated circuit; and a first signal distribution network distributing a plurality of supply lines from a center of said programmable integrated circuit, said plurality of supply lines comprising at least n signals, said first signal distribution network comprising:

a first group of n multiplexer circuits, each multiplexer circuit of said first group having an output coupled to a column distribution line of said first column circuit, wherein each multiplexer circuit of said first group receives said plurality of supply lines as input and wherein any of said n column distribution lines of said first column circuit can be coupled to any supply line.

8. An apparatus as described in claim 7 wherein n is at least 8.

9. An apparatus as described in claim 7 wherein said plurality of supply lines are disposed horizontally and wherein said n column distribution lines are disposed vertically within said programmable integrated circuit.

10. An apparatus as described in claim 7 wherein said first column circuit comprises a plurality of vertically disposed configurable logic circuits.

11. An apparatus as described in claim 7 further comprising:

a second column circuit having n bottom column distribution lines disposed vertically within a bottom half of said programmable integrated circuit and extending lengthwise substantially one half the length of said programmable integrated circuit; and a second signal distribution network distributing said plurality of supply lines from said center of said programmable integrated circuit, said second signal distribution network comprising:

a second group of n multiplexer circuits, each multiplexer circuit of said second group having an output coupled to a bottom column distribution line of said second column circuit, wherein each multiplexer circuit of said second group receives said plurality of supply lines as input and wherein any of said n bottom column distribution lines of said second column circuit can be coupled to any supply line.

12. An apparatus as described in claim 7 wherein each of said first group of multiplexer circuits comprise an arrangement of programmable interconnect points disposed at cross points of a column distribution line and said plurality of supply lines.

13. An apparatus as described in claim 7 wherein said first group of multiplexers and said plurality of supply lines are disposed within a channel located ¼ length from the top of said programmable integrated circuit and wherein said second group of multiplexers and said plurality of supply lines are disposed within a channel located ¼ length from the bottom of said programmable integrated circuit.

14. In a programmable integrated circuit, an apparatus comprising:

(a) a first column circuit having n column distribution lines disposed vertically within a top half of said programmable integrated circuit and extending lengthwise substantially one half the length of said programmable integrated circuit;

(b) a first signal distribution network distributing a plurality of supply lines within said programmable integrated circuit, said plurality of supply lines comprising at least n signal lines, said first signal distribution network comprising:

a first group of n multiplexer circuits, each multiplexer circuit of said first group having an output coupled to a column distribution line of said first column circuit and wherein each multiplexer circuit of said first group receives said plurality of supply lines as input; and (c) wherein said plurality of supply lines comprise a group of interconnect lines which provide coupling to a programmable local interconnect structure.

15. An apparatus as described in claim 14 wherein any of said n column distribution lines of said first column circuit can be coupled to any supply line.

16. An apparatus as described in claim 15 wherein said plurality of supply lines are disposed horizontally and wherein said n column distribution lines are disposed vertically within said programmable integrated circuit and wherein said first column circuit comprises a plurality of vertically disposed configurable logic circuits.

17. An apparatus as described in claim 14 further comprising:

a second column circuit having n bottom column distribution lines disposed vertically within a bottom half of said programmable integrated circuit and extending lengthwise substantially one half the length of said programmable integrated circuit; and a second signal distribution network distributing said plurality of supply lines from said center of said programmable integrated circuit, said second signal distribution network comprising:

a second group of n multiplexer circuits, each multiplexer circuit of said second group having an output coupled to a bottom column distribution line of said second column circuit, wherein each multiplexer circuit of said second group receives said plurality of supply lines as input wherein any of said n bottom column distribution lines of said second column circuit can be coupled to any supply line.

18. An apparatus as described in claim 14 wherein each of said first group of multiplexer circuits comprise an arrangement of programmable interconnect points disposed at cross points of a column distribution line and said plurality of supply lines.

19. In a programmable integrated circuit, a circuit arrangement comprising:

a first channel disposed horizontally within said programmable integrated circuit at a point substantially ¾ from the bottom of said programmable integrated circuit;

a second channel disposed horizontally within said programmable integrated circuit at a point substantially ¼ from said bottom, said first and second channels for containing multiplexer circuits and supply lines within a signal distribution network; and a first directional line multiplexed at the top of said programmable integrated circuit, said first directional line extending vertically downward ¼ from said top of said programmable integrated circuit to said first channel and coupled to said signal distribution network.

20. A circuit arrangement as described in claim 19 further comprising:

a second directional line multiplexed at the bottom of said programmable integrated circuit, said second directional line extending vertically upward ¼ from said bottom of said programmable integrated circuit to said second channel and coupled to said signal distribution network, said signal distribution network for distributing deskewed signals for a plurality of configurable logic circuits.

21. A circuit arrangement as described in claim 20 further comprising:
- a first multiplexer circuit disposed within said top and coupled to drive said first directional line, said first multiplexer circuit receiving inputs from: a carry signal line; input/output circuits; and local interconnect lines of said programmable integrated circuit; and
- a second multiplexer circuit disposed within said bottom and coupled to drive said second directional line, said second multiplexer circuit receiving inputs from: input/output circuits; and local interconnect lines of said programmable integrated circuit.

22. A circuit arrangement as described in claim 21 further comprising:
- a top edge clock line extending horizontally within said top across ½ the width of said programmable integrated circuit, said top edge clock line coupled to an input pad of said programmable integrated circuit and wherein said first multiplexer receives said top edge clock line as an additional input; and
- a bottom edge clock line extending horizontally within said bottom across ½ the width of said programmable integrated circuit, said bottom edge clock line coupled to an input pad of said programmable integrated circuit and wherein said second multiplexer receives said bottom edge clock line as an additional input.

23. A circuit arrangement as described in claim 20 further comprising:
- a third channel disposed horizontally within said programmable integrated circuit at a point substantially ½ from said bottom; and
- a third directional line multiplexed within said third channel, said third directional line extending vertically upward ¼ length to said first channel and coupled to said signal distribution network; and
- a fourth directional line multiplexed at said third channel, said fourth directional line extending vertically downward ¼ length to said second channel and coupled to said signal distribution network.

24. A circuit arrangement as described in claim 23 further comprising:
- a first middle multiplexer circuit disposed within said third channel and coupled to drive said third directional line, said first middle multiplexer circuit receiving inputs from local interconnect lines of said programmable integrated circuit; and
- a second middle multiplexer circuit disposed within said third channel and coupled to drive said fourth directional line, said second middle multiplexer circuit receiving inputs from local interconnect lines of said programmable integrated circuit.

25. In a programmable integrated circuit, a circuit arrangement comprising:
- a first channel disposed horizontally within said programmable integrated circuit at a point substantially a first distance from the bottom of said programmable integrated circuit, said first channel having coupling points to local interconnect lines;
- a second channel disposed horizontally within said programmable integrated circuit at a point substantially a second distance from the top of said programmable integrated circuit, said second channel for containing multiplexer circuits and supply lines within a signal distribution network, said first distance larger than said second distance; and
- a first directional line multiplexed within said first channel, said first directional line extending vertically upward to said second channel and coupled to said signal distribution network, wherein said first directional line can carry signals from said local interconnect lines.

26. A circuit arrangement as described in claim 25 further comprising:
- a third channel disposed horizontally within said programmable integrated circuit at a point substantially said second distance from said bottom, said third channel for containing multiplexer circuits and supply lines within a signal distribution network; and
- a second directional line multiplexed within said first channel, said second directional line extending vertically downward to said third channel and coupled to said signal distribution network, wherein said second directional line can carry signals from said interconnect lines, and wherein said first distance is ½ length of said programmable integrated circuit and wherein said second distance is ¼ length of said programmable integrated circuit.

27. In a programmable integrated circuit, a circuit arrangement comprising:
- a top edge clock signal line disposed within a periphery of said integrated circuit;
- a first channel disposed horizontally within said integrated circuit at a point substantially a first distance from the top of said integrated circuit;
- a first multiplexer disposed within said top and coupled to receive as inputs: a carry out signal; at least one input from an input/output circuit; signals from local interconnect; and said top edge clock signal line; and
- a first directional line coupled to an output of said first multiplexer and extending vertically downward by said first distance from said top of said integrated circuit to said first channel.

28. A circuit arrangement as described in claim 27 further comprising:
- a first demultiplexer coupled to receive said first directional line; and
- said first demultiplexer for selectively supplying signals from said first directional line to: a signal distribution network; programmable long line interconnects; and programmable local interconnects, wherein said signal distribution network is disposed within said first channel and supplies deskewed signals to a plurality of configurable logic circuits.

29. A circuit arrangement as described in claim 28 further comprising:
- a plurality of column circuits each having a top column distribution line disposed vertically within a top half of said integrated circuit and extending lengthwise substantially one half the length of said integrated circuit, each of said plurality of column circuits comprising a plurality of vertically disposed configurable logic circuits; and
- wherein said signal distribution network distributes said signals from said first directional line to at least one top column distribution line of said plurality of column circuits and wherein said first distance is ¼ length of said integrated circuit.

30. A circuit arrangement as described in claim 28 further comprising:
- a bottom edge clock signal line disposed within a periphery of said integrated circuit;

a second channel disposed horizontally within said integrated circuit at a point substantially a second distance from the bottom of said integrated circuit;

a second multiplexer disposed within said bottom and coupled to receive as inputs: at least one input from an input/output circuit; signals from local interconnect; and said bottom edge clock signal line;

a second directional line coupled to an output of said second multiplexer and extending vertically upward from said bottom to said second channel and coupled to an input of a second demultiplexer; and said second demultiplexer for selectively supplying signals from said second directional line to: a signal distribution network; said programmable long line interconnects; and programmable local interconnects, wherein said signal distribution network is disposed within said second channel and supplies deskewed signals to a plurality of configurable logic circuits.

31. A circuit arrangement as described in claim 30 further comprising:

a plurality of bottom column circuits each having a bottom column distribution line disposed vertically within a bottom half of said integrated circuit and extending lengthwise substantially one half the length of said integrated circuit, each of said plurality of bottom column circuits comprising a plurality of vertically disposed configurable logic circuits; and wherein said signal distribution network of said second channel distributes said signals from said second directional line to at least one bottom column distribution line of said plurality of bottom column circuits, and wherein said second distance is ¼ length of said integrated circuit.

32. In a programmable integrated circuit, a clock distribution arrangement comprising:

a first column of input/output circuits disposed vertically along a first edge of said integrated circuit substantially along a top half of said integrated circuit;

a second column of input/output circuits disposed vertically along said first edge substantially along a bottom half of said integrated circuit;

a first edge clock signal line disposed vertically along said first edge;

a first signal distribution network disposed within said integrated circuit at a point substantially a first distance from a top of said integrated circuit, said first signal distribution network coupled to receive said first edge clock signal line and for distributing signals to said first column of input/output circuits; and a second signal distribution network disposed within said integrated circuit at a point substantially a second distance from a bottom of said integrated circuit, said second signal distribution network coupled to receive said first edge clock signal line and for distributing signals to said second column of input/output circuits.

33. A clock distribution arrangement as described in claim 32 further comprising:

a second edge clock signal line disposed vertically along said first edge;

said first signal distribution network coupled to receive said second edge clock signal line; and said second signal distribution network coupled to receive said second edge clock signal line, and wherein said first distance and said second distance are each ¼ length of said integrated circuit.

34. A clock distribution arrangement as described in claim 33 wherein said first signal distribution network is located within a first channel disposed horizontally within said integrated circuit at said point substantially ¼ from said top of said integrated circuit and wherein said second signal distribution network is located within a second channel disposed horizontally within said integrated circuit at said point substantially ¼ from said bottom of said integrated circuit.

35. A clock distribution arrangement as described in claim 33 further comprising:

a plurality of vertically disposed columns of configurable logic circuits adjacent to said first column of input/output circuits; and a deskew signal distribution network disposed within horizontal channels within said integrated circuit and coupled to each column of said plurality of columns of configurable logic circuits to distribute deskewed signals therein, wherein said deskew signal distribution network is also coupled to said first column of input/output circuits.

36. A clock distribution arrangement as described in claim 33 further comprising:

a first pad disposed along said top of said integrated circuit, said first pad coupled to said first edge clock signal line; and a second pad disposed along said bottom of said integrated circuit, said second pad coupled to said second edge clock signal line.

37. In a programmable integrated circuit, a clock distribution arrangement comprising:

a first column of input/output circuits disposed vertically along a first edge of said integrated circuit substantially along a top half of said integrated circuit;

a second column of input/output circuits disposed vertically along said first edge substantially along a bottom half of said integrated circuit;

a first edge clock signal line disposed vertically along said first edge;

a plurality of horizontally disposed supply lines for carrying deskewed signals; and a first signal distribution network disposed within said integrated circuit at a point substantially a first distance from a top of said integrated circuit, said first signal distribution network coupled to receive said first edge clock signal line and coupled to receive said plurality of deskewed signals, said first signal distribution network for distributing signals to said first column of input/output circuits.

38. A clock distribution arrangement as described in claim 37 further comprising:

a second signal distribution network disposed within said integrated circuit at a point substantially a second distance from a bottom of said integrated circuit, said second signal distribution network coupled to receive said first edge clock signal line and coupled to receive said plurality of deskewed signals, said second signal distribution network for distributing signals to said second column of input/output circuits.

39. In a programmable integrated circuit, a circuit arrangement comprising:

a channel disposed horizontally within said programmable integrated circuit at a predetermined location, said channel including a multiplexer circuit and a plurality of supply lines within a signal distribution network; and a directional line multiplexed at the top of said programmable integrated circuit, said directional line extending vertically downward and coupled to said signal distribution network.

40. In a programmable integrated circuit, a clock distribution arrangement comprising:

a deskewed clock distribution network coupled to a clock source disposed within said integrated circuit and coupled to a plurality of input/output circuits disposed within said integrated circuit;

a low delay clock distribution network coupled to said clock source and coupled to said plurality of input/output circuits; and wherein said plurality of input/output circuits receive a low delay clock signal from said low delay clock distribution network and a deskewed clock signal from said deskewed clock distribution network.

* * * * *